United States Patent
Weigl

(10) Patent No.: US 8,870,515 B2
(45) Date of Patent: Oct. 28, 2014

(54) METHOD AND DEVICE FOR STORING GLASS PLATES FOR PHOTOVOLTAIC MODULES

(75) Inventor: Helmut Weigl, Straubing (DE)

(73) Assignee: Grenzebach Maschinebau GmbH, Asbach-Baeumenheim (DE)

(*) Notice: Subject to any disclaimer, the term of this patent is extended or adjusted under 35 U.S.C. 154(b) by 763 days.

(21) Appl. No.: 13/061,942

(22) PCT Filed: Aug. 27, 2009

(86) PCT No.: PCT/DE2009/001203
§ 371 (c)(1),
(2), (4) Date: Mar. 2, 2011

(87) PCT Pub. No.: WO2010/025706
PCT Pub. Date: Mar. 11, 2010

(65) Prior Publication Data
US 2011/0174700 A1 Jul. 21, 2011

(30) Foreign Application Priority Data
Sep. 2, 2008 (DE) .................. 10 2008 045 369

(51) Int. Cl.
*B65G 49/06* (2006.01)
*H01L 21/67* (2006.01)

(52) U.S. Cl.
CPC ............ *B65G 49/067* (2013.01); *B65G 49/068* (2013.01); *B65G 2249/04* (2013.01); *B65G 2249/02* (2013.01); *H01L 21/67259* (2013.01); *Y10S 901/49* (2013.01)
USPC .............................. 414/274; 294/219; 901/49

(58) Field of Classification Search
CPC ................... B65G 49/06; H01L 21/67288
USPC ............................................ 414/274
See application file for complete search history.

(56) References Cited

U.S. PATENT DOCUMENTS

| | | | |
|---|---|---|---|
| 5,980,197 A | 11/1999 | Lehto | |
| 6,719,848 B2 * | 4/2004 | Faykosh et al. | 118/718 |
| 7,137,164 B2 * | 11/2006 | Dickerson et al. | 15/77 |
| 7,751,939 B2 * | 7/2010 | Cho et al. | 700/254 |
| 8,047,756 B2 * | 11/2011 | Tuffs et al. | 414/392 |

(Continued)

FOREIGN PATENT DOCUMENTS

| | | |
|---|---|---|
| CN | 2085158 U | 9/1991 |
| CN | 101040603 A | 9/2007 |

(Continued)

OTHER PUBLICATIONS

Office Action received in Chinese Application No. 200980141173.2, Date of mailing: Oct. 16, 2012, 24 pages.

*Primary Examiner* — James Keenan
(74) *Attorney, Agent, or Firm* — Slater & Matsil, L.L.P.

(57) ABSTRACT

Disclosed are a device and a method for picking up glass plates from at least one production line in order to convey said glass plates on to a storage housing or a coating plant. An embodiment of the device includes: a) a linearly movable, vertically installed main lifting column with a lifting rake that can be vertically moved therealong; b) a horizontal drive unit for the lifting rake; c) at least one sensor which is mounted on a fork of the lifting rake and is used for detecting the availability of the targeted storage place of a glass plate; d) at least one sensor which is mounted on a fork of the lifting rake and is used for detecting if a glass plate is located on the lifting rake; e) at least one sensor that is mounted on a fork of the lifting rake and is used for detecting cracks in a glass plate.

17 Claims, 9 Drawing Sheets

(56) References Cited

U.S. PATENT DOCUMENTS

| | | | |
|---|---|---|---|
| 8,444,368 B2 * | 5/2013 | Irie | 414/744.3 |
| 8,465,072 B2 * | 6/2013 | Wu et al. | 294/213 |
| 2004/0111823 A1 | 6/2004 | Blattner et al. | |
| 2006/0216137 A1 | 9/2006 | Sakata et al. | |

FOREIGN PATENT DOCUMENTS

| | | | | |
|---|---|---|---|---|
| CN | 200956750 Y | 10/2007 | | |
| CN | 101112931 A | 1/2008 | | |
| DE | 197 12 368 A1 | 10/1998 | | |
| DE | 101 57 833 A1 | 6/2003 | | |
| DE | 11 2004 001 210 T5 | 6/2006 | | |
| DE | 10 2005 060 452 A1 | 6/2007 | | |
| EP | 1 248 076 A1 | 10/2002 | | |
| EP | 1 647 532 A1 | 4/2006 | | |
| JP | 2001253536 A | 9/2001 | | |
| JP | 2009091075 A | * | 4/2009 | B65G 49/06 |
| KR | 2003043220 A | * | 6/2003 | G02F 1/13 |

* cited by examiner

METHOD AND DEVICE FOR STORING GLASS PLATES FOR PHOTOVOLTAIC MODULES

This patent application is a national phase filing under section 371 of PCT/DE2009/001203, filed Aug. 27, 2009, which claims the priority of German patent application 10 2008 045 369.2, filed Sep. 2, 2008, each of which is hereby incorporated by reference in its entirety.

TECHNICAL FIELD

The invention relates to the automatic temporarily storing of glass plates for rectangular photovoltaic modules comprising of two same sized glass plates disposed on top of each other using an intermediate layer connecting the glass plates.

BACKGROUND

Modern glass facades are often not only functional elements of a building but serve increasingly as a solar power generator. Customized solar modules allow the exact integration in building structures and profiles. Semitransparent solar cells but also opaque solar cells with transparent regions let photovoltaic glazings appear flooded with light. The solar cells provide the desired effect of sun and glare protection.

The production of such photovoltaic installations requires working conditions which are known from semiconductor and integrated circuit manufacturing. These conditions are called clean room conditions Viewed from the outside, a photovoltaic module is a composition of a substrate plate made from glass, photovoltaic elements, a glass plate as top glass and a adhesive film which combines these elements under heat.

In a manufacturing process, the components, in particular the substrate plates and the top glass or the finished photovoltaic modules are transported and moved on conveyors to the respective destination in big fabrication plants. This can be done in several production lines at the same time.

If there is an unforeseeable interruption in such a production plant, the components to be processed next must be temporarily stored at a location. The process of storing these components temporarily must be carried out in a fast and safe manner so that the production process is not interrupted more than necessary.

The prior art reference DE 197 12 368 A1 discloses a process for moving objects from a first place to a second place whereas the object is connected to a holding mechanism while moved. The problem may be solved by a process for moving objects safely under any circumstances. The movable objects may be glass plates. The problem is solved by the fact that the drive up of the holding mechanism to the object to be moved to the first or second place takes into account the actual location and/or orientation of the object. The holding mechanism can be adjusted by taking advantage of the free rotating and/or pivoting of itself around one or more axes.

In the further apparatus claim 7 is in more detail disclosed that the object to be moved is a glass plate, the first place is a loader, the second place is a roller conveyor, and the holding mechanism is a vacuum frame. Moreover, the holding mechanism is also related to signaling device, a decoupling device, a detection device and a processing device. However, the reference does not disclose means for prompt and safe detection and a fast reception of larger glass plates.

DE 10 2005 060 452 A1 discloses an apparatus for manipulating of flat materials in the preamble of the first claim. The apparatus includes a support frame with at least one vacuum frame, arranged in a support frame, and vacuum heads to be evacuated for receiving flat materials to be sucked. The problem is solved by an apparatus for manipulating flat materials which can alternatively handle different formats as well as, for example, coated and uncoated flat materials. At the same time the apparatus has a simple design.

The invention, or rather the solution of this problem, is provided by the fact that the support frame is rotatable between a substantially vertical position and a substantially horizontal position wherein the support frame alternatively comprises a horizontal position with upward looking suction heads or a horizontal position with downward looking suction heads. This reference does not suggest means for fast and secure detection and means for speedy reception of large glass plates.

U.S. Pat. No. 5,980,197 shows a method for laying spacing ribs between pre-laminated glass panels. The prior art described in this reference shows that the ribs were manually inserted. Therefore, the objective is to provide this process automatically. With this in mind the glass plates are moved by vacuum elements and the ribs are moved by grippers and are released at a respective place. A particular speed and care seems not to be necessary for this process.

SUMMARY OF THE INVENTION

In accordance with one embodiment an apparatus for detecting, receiving and securely storing glass plates in a storage device is disclosed.

In accordance with another embodiment of the invention a method for detecting, receiving and securely storing glass plates in a storage device is disclosed.

BRIEF DESCRIPTION OF THE DRAWINGS

The invention will be described with reference to the following figures.

Figure 1:
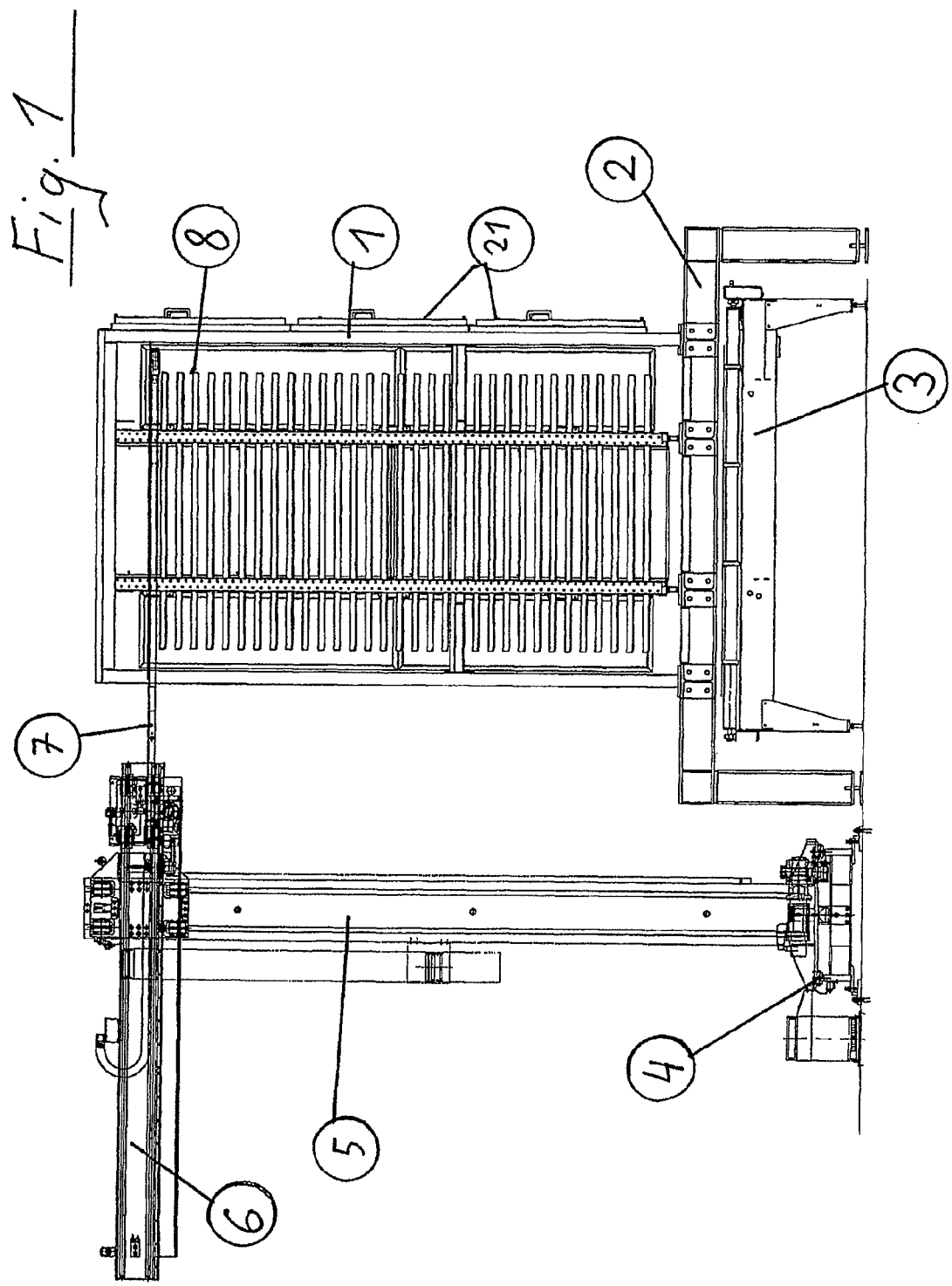
FIG. 1: A cross sectional view of the arrangement.

The following list of reference symbols may be used in conjunction with the drawings:
(1) Storage housing
(2) Storage housing base
(3) Roller conveyor
(4) Rail
(5) Main lifting column
(6) Horizontal traversing unit
(7) Lifting rake
(8) Stacking rake
(9) Servo drive unit
(10) Horizontal drive unit
(11) Horizontal drive unit
(12) Feed line
(13) Feed line
(14) Sensor
(15) Sensor
(16) Crossbar
(17) Fork
(18) Fixing elements
(19) Back wall

(20) Sensor
(21) Storage entrance
(22) Coating station
(23) Net
(24) Towing rope
(25) Net container
(26) Rope drive
(27) Return pulleys
(28) Net guide rail

DETAILED DESCRIPTION OF ILLUSTRATIVE EMBODIMENTS

FIG. 1 shows a cross sectional view of an entire system. The storage housing (1) is mounted on the storage housing base (2) and a roller conveyer (3) traverses beneath it. Only a portion of the roller conveyor is shown. Parallel to a longitudinal side of the storage housing (1) is a rail (4) of a main lifting column (5) arranged. The main lifting column (5) holds the horizontal traversing unit (6) for the lifting rake (7).

FIG. 1 shows the lifting rake (7) in the upper most position at the same height as the upper most stacking rake (8) in the storage housing (1). The storage housing (1) comprises several storage entrances (21) on its backside. The storage entrances (21) may be used to manually remove cullet. Another inventive possibility to remove cullet automatically will be described with respect to FIG. 5.

Figure 2:
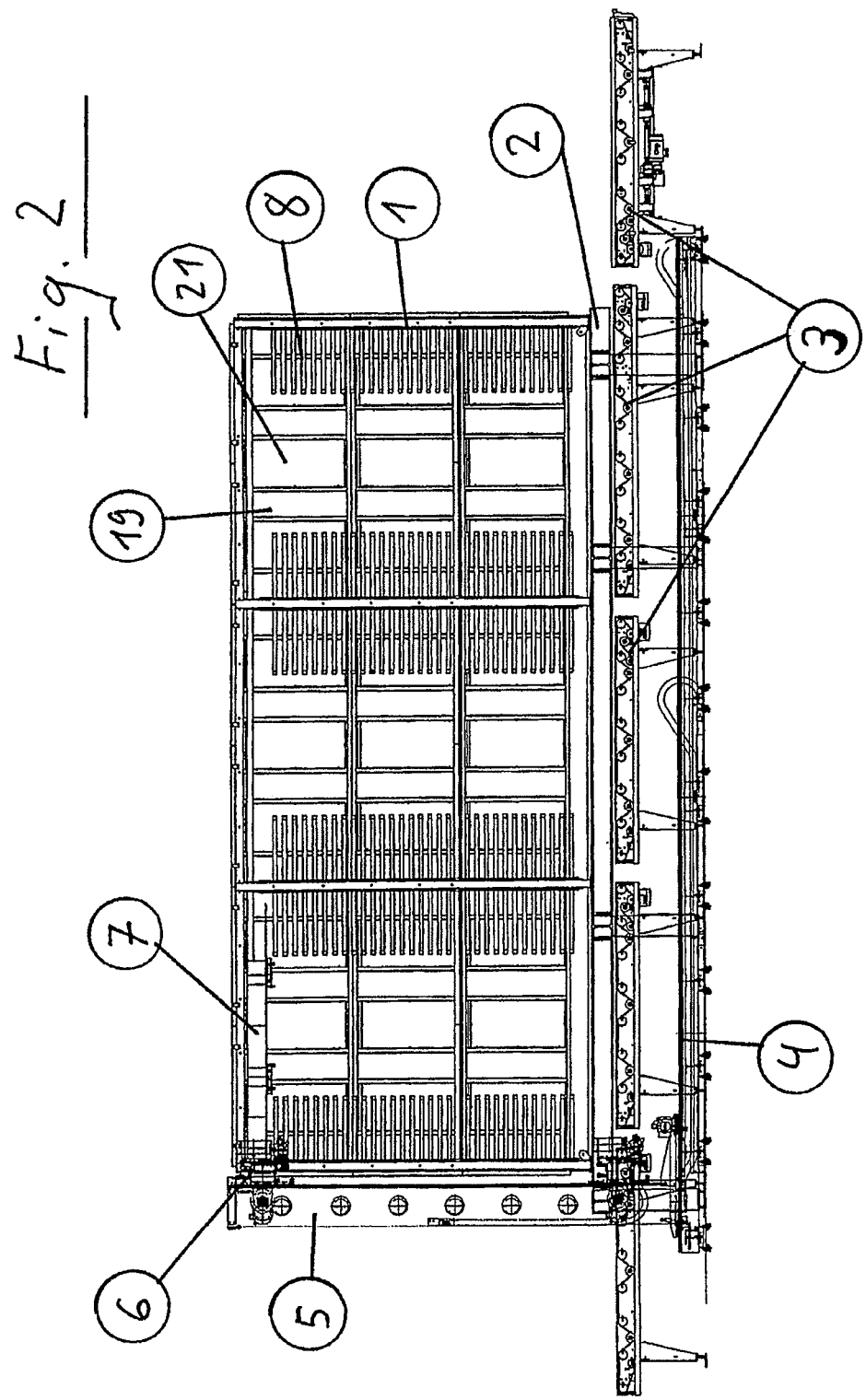
FIG. 2: A cross sectional view of the storage device.

FIG. 2 shows a cross sectional view of the storage housing (1) with its storage housing base (2). FIG. 2 shows exemplary a total of 5 roller conveyors (3) of corresponding production lines. In FIG. 1 only a part of the production line is shown. In the lower part of FIG. 2 is a rail (4) of the main lifting column (5) disclosed, in which the main lifting rail (5) is located in the leftmost position of the rail (4) and the storage housing (1). In FIG. 2, the lifting rake (7) extends orthogonal to the main lifting column (5) and is shown in its upper most position. A back view of the horizontal traversing unit (6) for the lifting rake (7) is shown. Similarly, a back wall (19) of the storage housing (1) with the storage entrances (21) in a front view can be seen.

Figure 3:
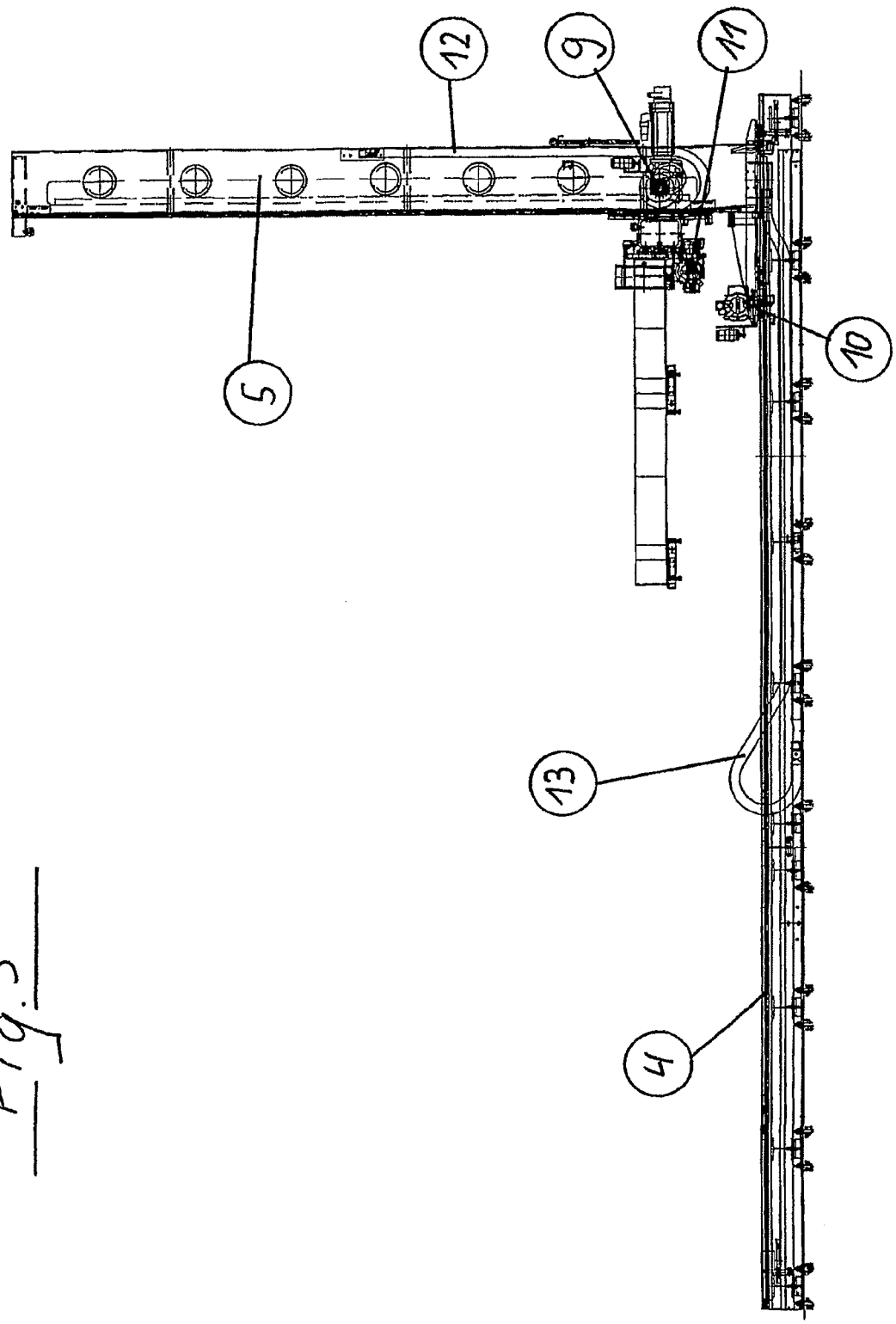
FIG. 3: A detailed view of the main lifting column.

FIG. 3 shows a detail drawing of the main lifting column (5) from the opposite side relative to FIG. 2 in which the lifting rake (7) is located in a lower position relative to the storage housing (1). The rail (4) comprises a horizontal drive unit (10) of the main lifting column (5). The feed line necessary for this drive unit is shown as element 13. The servo drive unit (9) for the vertical movement of the lifting rake (7) and the technical equipment of the lifting rake (7) is controlled by the feed line (12).

Figure 4:
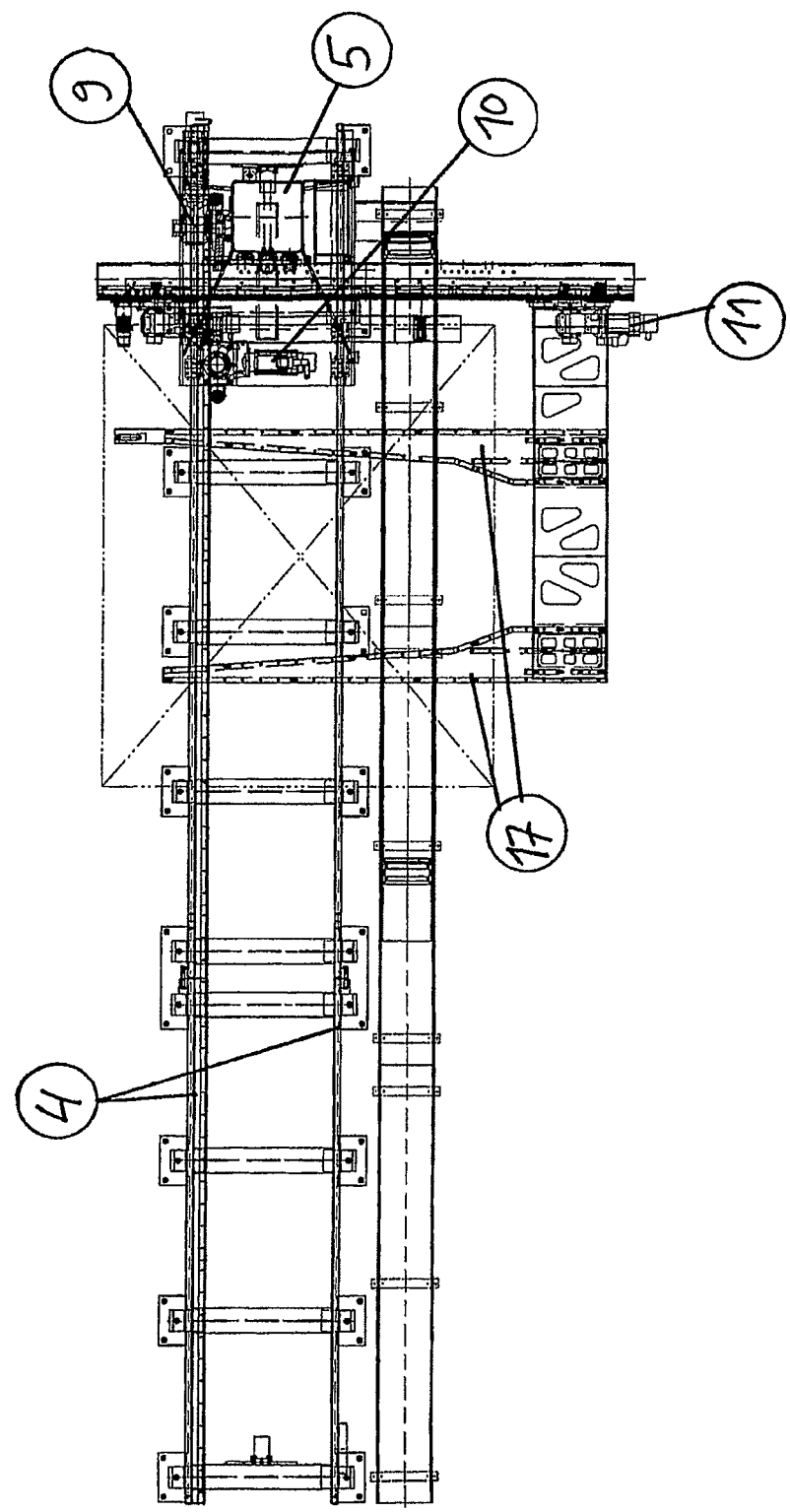
FIG. 4: A cross section through the main lifting column.

FIG. 4 shows a cross section through the main lifting column (5), particularly focused on the fork (17) of the lifting rake (7). From the top are shown: rail (4) and the horizontal drive unit (10) of the main lifting column (5), plus the servo drive unit (9) for the vertical movement of the lifting rake (7). The horizontal drive unit (11) of the lifting rake (7) drives the two forks (17) in and out of the storage housing (1). In order to pick up and to unload the glass plates the lifting rake (7) is briefly lifted and lowered using control engineering.

Figure 5:
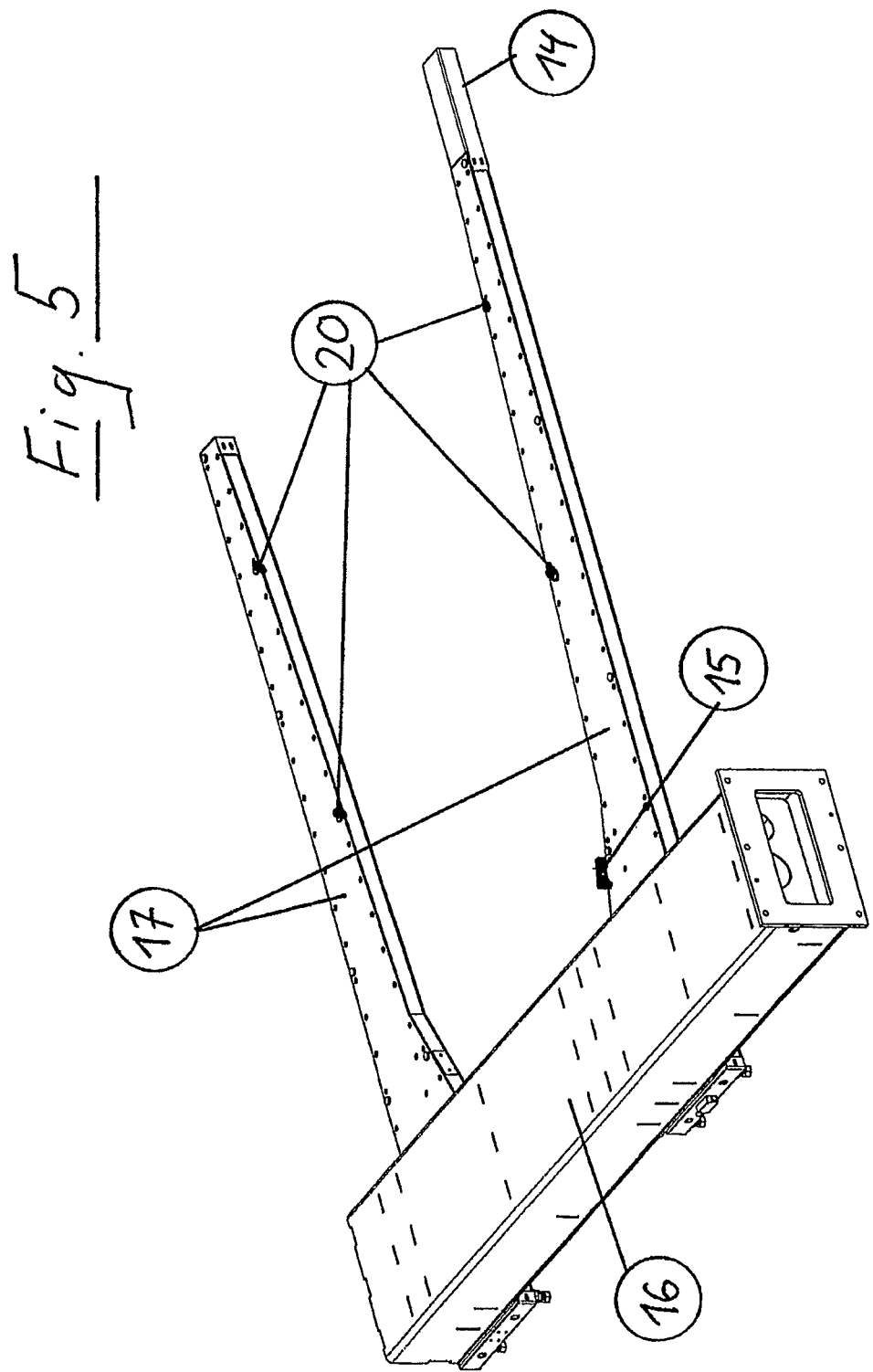
FIG. 5: A perspective view of the lifting rake.

FIG. 5 shows a perspective view of the lifting rake (7) and provides more detail about this process. The lifting rake (7) shows specific construction features, which makes it on the one hand lightweight and at the same time relative insensitive against deformation. It is a honeycomb construction using sheet steel. This construction is superior for the intended use relative to other constructions using aluminum or Kevlar.

In the front is the crossbar (16) as rectangular holm disclosed, the holm being connected to two forks (17) at the left end and the right end. At the narrow end of the fork (17) of the lifting rake (7) is a sensor (14) provided for the storage space occupancy in the storage housing (1). An additional sensor (14) may be provided at the other fork (17). For example, both sensors (14) may comprise different coverage angles and/or different sensitivity characteristics and may complement each other.

The same is true for the sensor (15) for the detection of the occupancy of the lifting rake (7). The sensor together with an additional sensor (15) may gather additional information about how the relevant glass plate is sitting on the lifting rake. These sensors may work using ultrasonic sound and/or light.

The sensors (20) illuminate the glass plates at different positions and in different directions on the forks (17) and determines based on the scattered light of cracks whether the glass plat contains a risk of breaking or whether it is already broken. In this case, the damaged glass plate is moved by the lifting rake (7) to a designated position between the production lines from where they are disposed. To do this, the lifting rake (7) may remove the damaged glass plate with the help of the subjacent glass plate from the storage housing (1).

Figure 9:
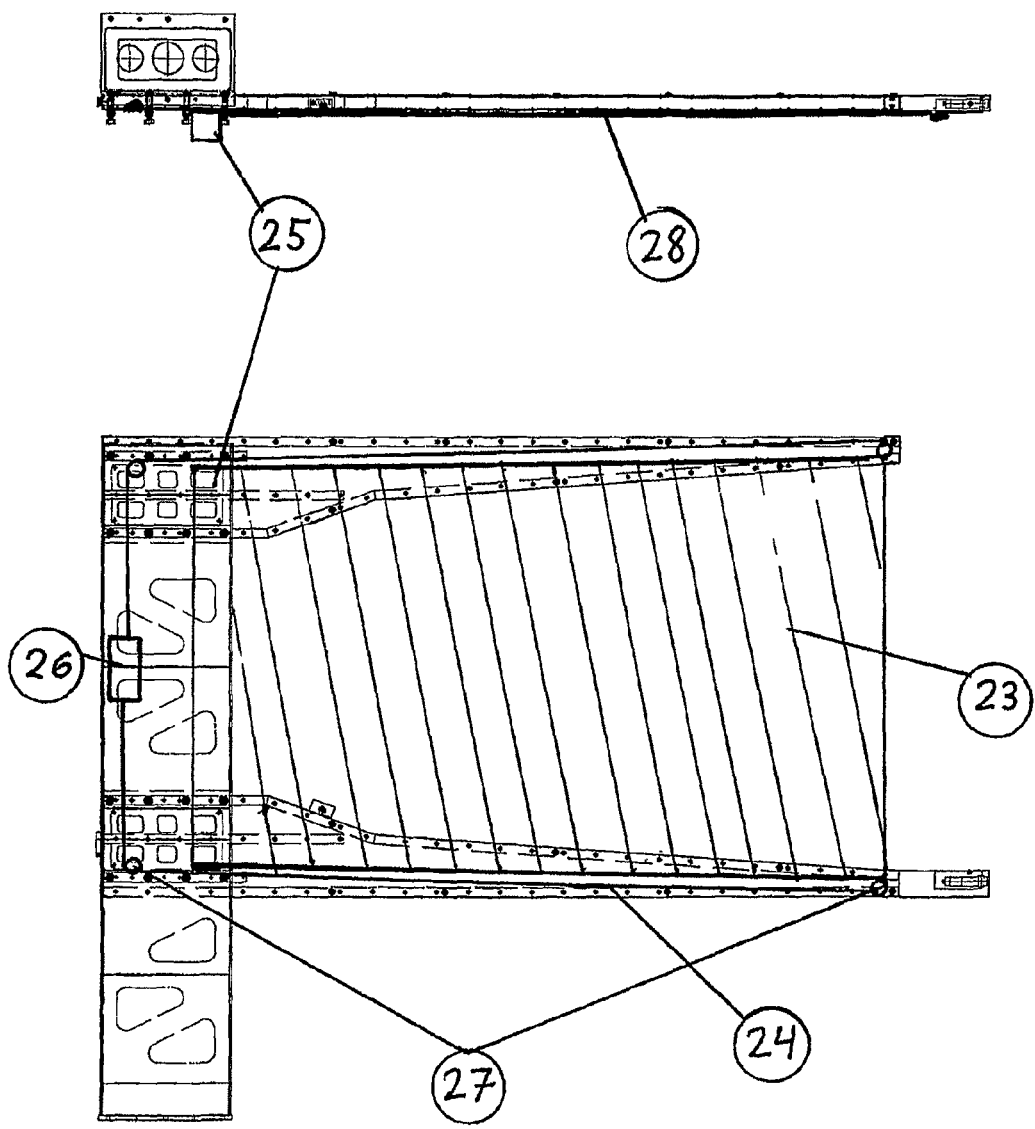
FIG. 9: An embodiment of the lifting rake.

An additional possibility is to span a net between the two forks (17) which collects the debris in case of an emergency. Details are shown in FIG. 9. A manual clean up of the storage housing (1) via the storage entrances (21) is omitted in this case.

Figure 6:
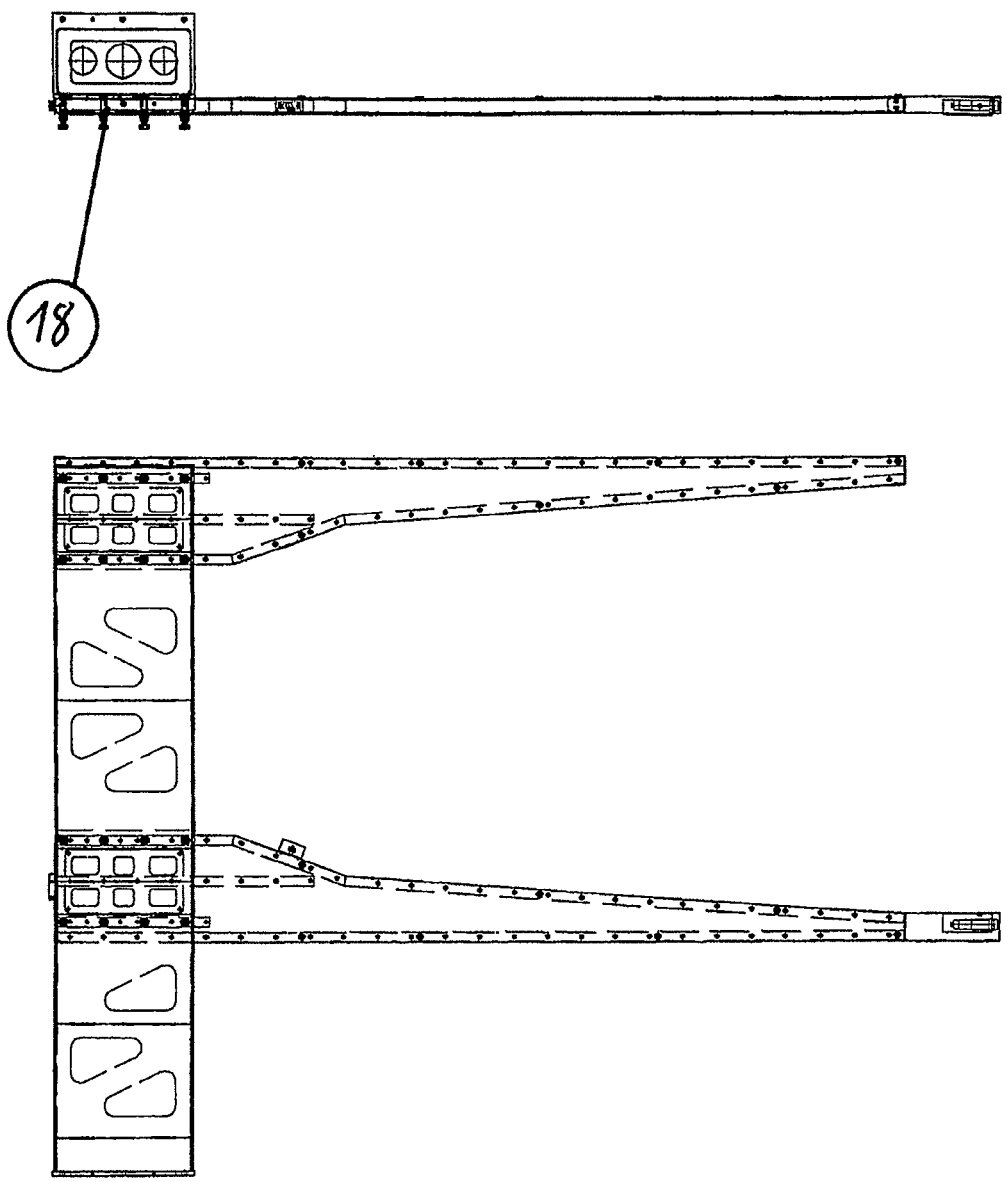
FIG. 6: Two cross sections of the lifting rake.

FIG. 6 shows a lifting rake (7) from different cross sectional views. Additional fixing elements (18) of the forks (17) at the crossbar (16) are disclosed.

Figure 7:
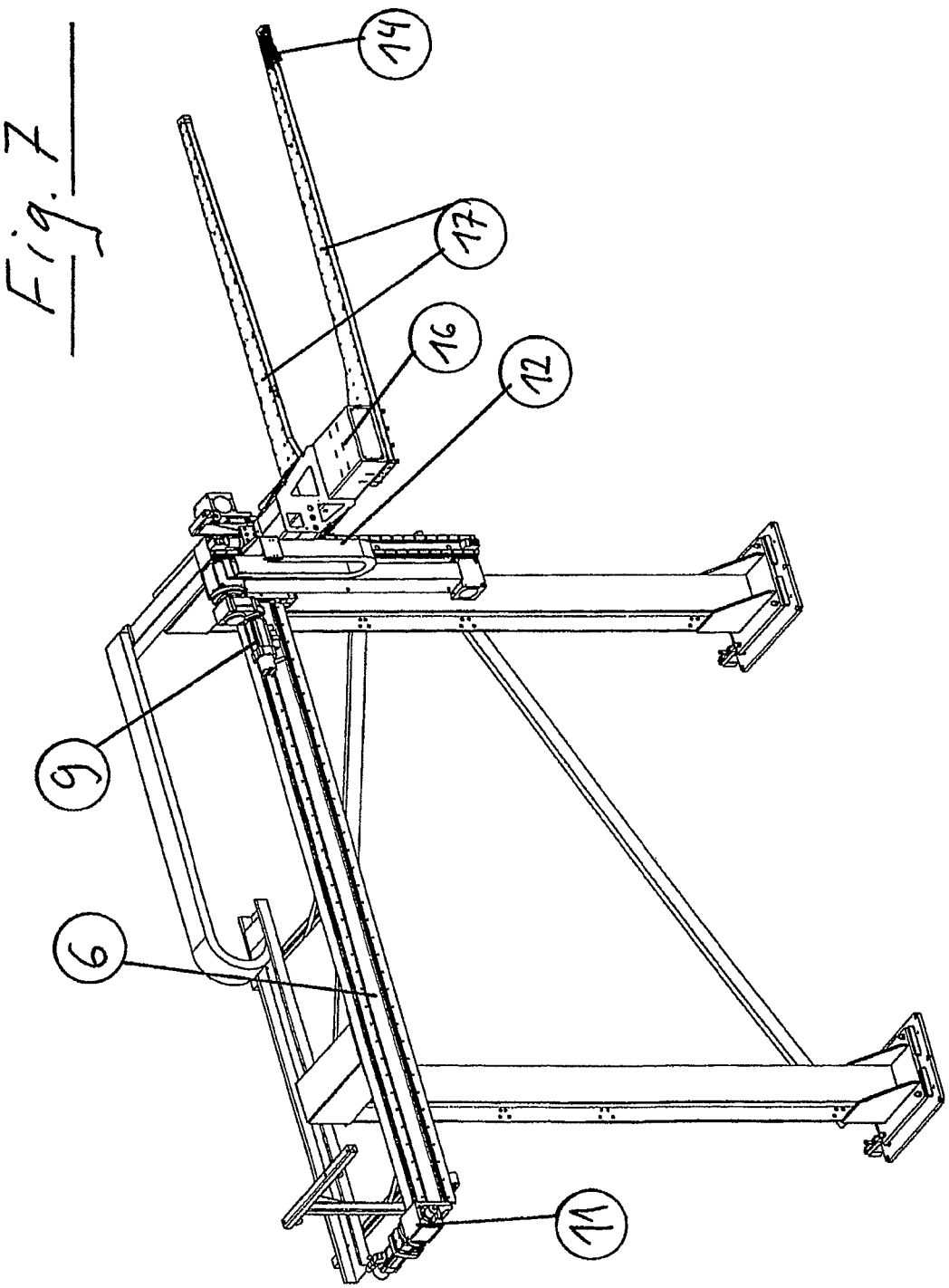
FIG. 7: A perspective view of the lifting device.

FIG. 7 shows a separate perspective illustration of a lifting device. As can be seen, the horizontal traversing unit (6) is held by two main lifting columns (5) which are connected to each other with struts running in a traverse direction. The horizontal drive unit (11) of the lifting rake (7), which moves the lifting rake over a drive belt, is clearly visible. Similarly, the servo drive unit (9) for the vertical movement of the lifting rake (7) and the chain-like feed line (12) for this vertical movement, and the sensors (14, 15, 20) are visible.

Figure 8:
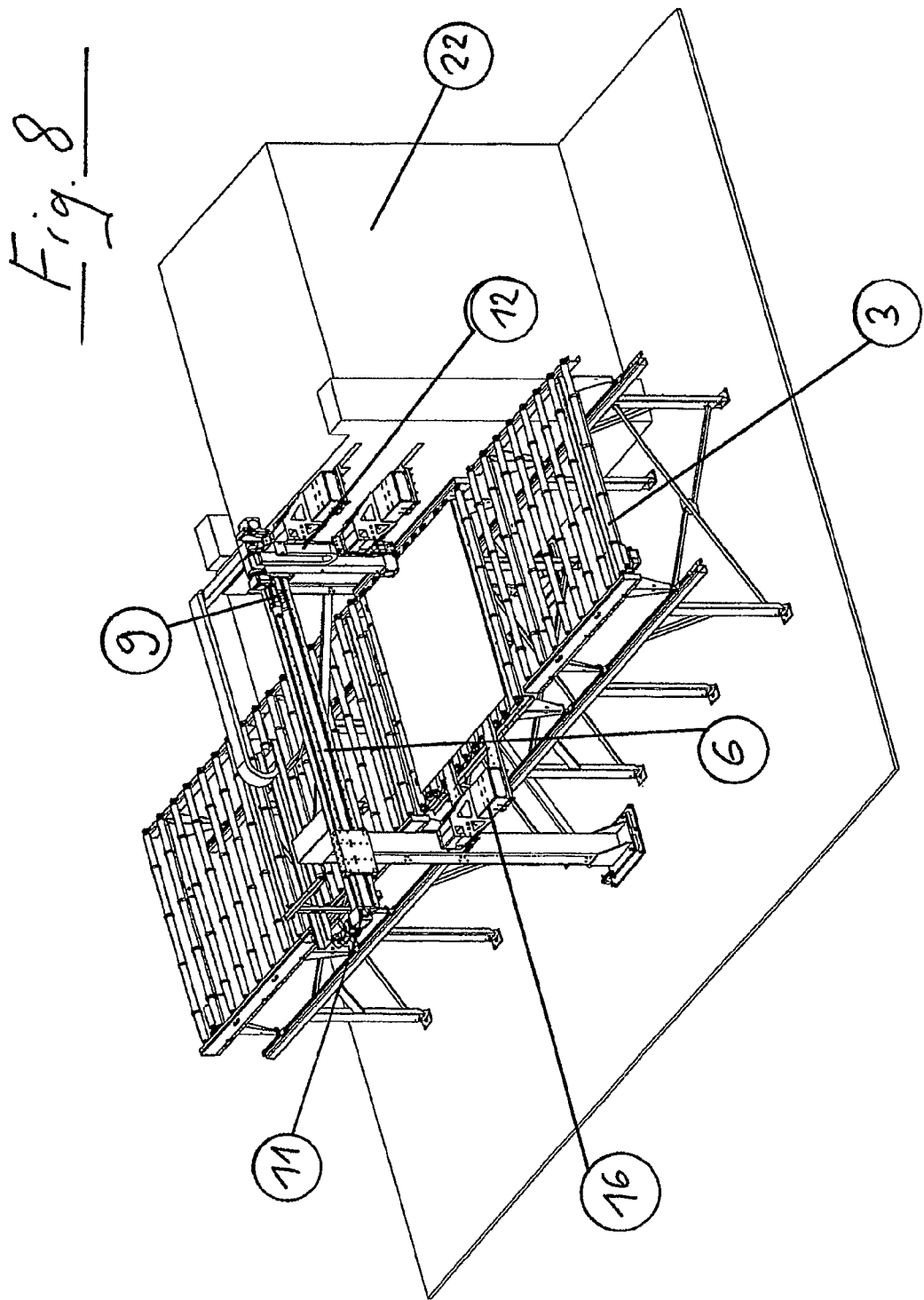
FIG. 8: A perspective view of a loading process.

FIG. 8 shows the inventive apparatus, which has been disclosed in detail in FIG. 7, together with a roller conveyor (3) while picking up glass plates from the production line for moving them to a coating station. As can be seen from this Figure, cross bars (16) located in two levels above each other are shown in a retracted stage at the coating station (22).

FIG. 9 shows an embodiment of the lifting rake (7) which can remove easily and cheaply damaged glass plates or parts thereof by means of a spanned net.

FIG. 9 shows that the wider and reinforced ends of the forks (17) of the lifting rake (7) do not point towards the inside but towards the outside. The purpose for such a construction is that the spanned net forms an equal rectangular area. It is noted that the spreading out of the net is also possible according to the embodiments of the forks (17) disclosed in FIGS. 4 and 7. In this case, however, the net guide rail (28) must be designed so that there is rectangular at the end. Another possibility would be to use an elastic net, which adapts to the changing distances between the two forks (17) when guided along the existing contour of the net guide rail (28).

In the region of the crossbar (16) located between the two forks (17), as shown in FIG. 9, is a net container (25) arranged. The net container (25) contains a rolled up net under the stress of a spring. The net can be pulled all the way to the tip of the forks (17). This is carried out via a rope drive (26) which pulls two pieces of a towing rope (24) out of the net container (25) against the strength of the spring. The two pieces of the towing rope (24) are guided over return pulleys (27) located at the tip of the forks (17). The spring is located in the net container (25). In the opposite case the rope drive (26) supports the rolling up of the net (23) in the net container (25) via a reversal of the rotating direction. A net guide rail (28), located on both sides of the inner edge of the forks (17) guarantees a failure free operation.

The interactive control of the lifting rake (7) and the elements of the main lifting column (4) in accordance with the detection of the glass plates, the control of the positioning of the glass plates with laser and/or sensors in the context of the production of photovoltaic elements in several production lines require a special control program.

The invention claimed is:

1. An apparatus comprising:
   a linearly movable, vertically installed, main lifting column with a vertically movable lifting rake;
   a horizontal drive unit of the lifting rake;
   at least one first sensor disposed on forks of the lifting rake, the at least one first sensor configured to detect an availability of a storage location for a glass plate;
   at least one second sensor disposed on the forks of the lifting rake, the at least one second sensor configured to detect the availability of the lifting rake for the glass plate; and
   at least one third sensor disposed on the forks of the lifting rake, wherein the at least one third sensor is configured to detect a damaged glass plate by illuminating the glass plate and determining based on scattered light whether the glass plate comprises a risk of breaking, and wherein the lifting rake is configured to remove the damaged glass plate from a production line.

2. The apparatus according to claim 1 wherein the at least one first, second and third sensors work on a basis of ultrasonic sound and/or light.

3. The apparatus according to claim 1 wherein a position, a type, and a speed of the glass plate are captured via the at least one first and second sensors.

4. The apparatus according to claim 1, further comprising a net located in a container at a crossbar between the forks of the lifting rake, the net configured to be rolled out and spanned between the forks.

5. The apparatus according to claim 4, wherein the net is an elastic net configured to adjust to changing distances of the forks.

6. The apparatus according to claim 4, wherein the lifting rake further comprises a net guide rail.

7. The apparatus according to claim 4, wherein the container further comprises a spring, and wherein the spring is configured to pull the net back into a rolled up position.

8. The apparatus according to claim 4, wherein the lifting rake further comprises a rope drive, and wherein the rope drive is configured to pull the net out into a spanned position.

9. A method for detecting a defective glass plate comprising:
   detecting a glass plate on a production line;
   moving a lifting rake to a height of the glass plate, the lifting rake being arranged at a main lifting column and being vertically movable relative to the main lifting column;
   moving the lifting rake via a horizontal drive under the glass plate, slightly lifting the lifting rake, and then moving the lifting rake and the glass plate to a starting position;
   illuminating the glass plate;
   receiving scattered light from the glass plate;
   evaluating whether or not the glass plate is defective;
   when the glass plate is defective, disposing the defective glass plate into a spanned net located between two forks;
   when the glass plate is not defective, moving the lifting rake to a predetermined height and moving the main lifting column to a predetermined location on the rail;
   detecting whether a first location in a storage housing is available and if so moving the glass plate into the first location with a horizontal traversing unit and if not searching for a second location; and
   moving the lifting rake to the starting position.

10. The method according to claim 9, further comprising spanning the net by pulling the net via a rope drive.

11. The method according to claim 9, wherein disposing the defective glass plate into a spanned net comprises pulling a net from a net container to provide the spanned net.

12. The method according to claim 9, wherein the spanned net is spanned using a spring.

13. An apparatus comprising:
    a linearly movable, vertically installed, main lifting column with a vertically movable lifting rake;
    a horizontal drive unit of the lifting rake;
    at least one first sensor disposed on forks of the lifting rake, the at least one first sensor configured to detect a storage space occupancy of a storage area in a storage housing;
    at least one second sensor disposed on the forks of the lifting rake, the at least one second sensor configured to detect the availability of the lifting rake for a glass plate;
    at least one third sensor disposed on the forks of the lifting rake, the at least one third sensor configured to detect a damaged glass plate; and
    a net located in a container at a crossbar between the forks of the lifting rake, the net configured to be rolled out and spanned between the forks.

14. The apparatus according to claim 13, wherein the at least one first sensor comprises two first sensors, and wherein each of the two first sensors is disposed on each of the forks respectively.

15. The apparatus according to claim 13, wherein the at least one second sensor comprises two second sensors, and wherein each of the two second sensors is disposed on each of the forks respectively.

16. The apparatus according to claim 13, wherein the at least one third sensor comprises two third sensors, and wherein each of the two third sensors is disposed on each of the forks respectively.

17. The apparatus according to claim 13, wherein the lifting rake is configured to remove the damaged glass plate from a production line.

* * * * *